(12) United States Patent
Tanielian

(10) Patent No.: US 8,987,580 B2
(45) Date of Patent: Mar. 24, 2015

(54) THERMOELECTRIC DEVICES AND METHODS OF MANUFACTURE

(71) Applicant: The Boeing Company, Chicago, IL (US)

(72) Inventor: Minas Tanielian, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 14/100,358

(22) Filed: Dec. 9, 2013

(65) Prior Publication Data

US 2014/0090683 A1    Apr. 3, 2014

Related U.S. Application Data

(62) Division of application No. 11/691,239, filed on Mar. 26, 2007, now Pat. No. 8,653,356.

(51) Int. Cl.
| | |
|---|---|
| *H01L 35/00* | (2006.01) |
| *H01L 35/28* | (2006.01) |
| *H01L 35/30* | (2006.01) |
| *H01L 37/00* | (2006.01) |
| *F25B 21/02* | (2006.01) |

(52) U.S. Cl.
CPC ............... *H01L 37/00* (2013.01); *H01L 35/30* (2013.01); *F25B 21/02* (2013.01); *H01L 35/00* (2013.01)
USPC ........................... 136/203; 136/200; 136/205

(58) Field of Classification Search
CPC ......... H01L 35/00; H01L 37/00; H01L 35/30; F25B 21/02
USPC .......................................... 136/200, 203, 205
See application file for complete search history.

(56) References Cited

U.S. PATENT DOCUMENTS

| 5,308,578 A * | 5/1994 | Wong ............................ 420/558 |
| 6,229,083 B1 | 5/2001 | Edelson |
| 2004/0195934 A1 | 10/2004 | Tanielian |

(Continued)

FOREIGN PATENT DOCUMENTS

EP    1419990 A2    5/2004

(Continued)

OTHER PUBLICATIONS

UK Intellectual Property Office Examination Report for Application No. GB0917962.3 under Section 18(3) dated Mar. 22, 2011.
European Patent Office (International Searching Authority) International Search Report and Written Opinion mailed May 4, 2009 for International Patent Application No. PCT/US08/058208 filed Mar. 26, 2008.

*Primary Examiner* — Jonathan Johnson
*Assistant Examiner* — Lindsey Bernier
(74) *Attorney, Agent, or Firm* — Klintworth & Rozenblat IP LLC

(57) ABSTRACT

Thermoelectric devices are provided. In one embodiment, a thermoelectric device may include a glass wafer defined by conductive vias, a second wafer, and a plurality of metal film disposed between the glass wafer and the second wafer and against solid, conductive, integral, end surfaces of the conductive vias. A nanogap may be disposed between the metal film and the second wafer. The nanogap may have been created by applying a voltage extending between the conductive vias and the second wafer. Methods of forming the devices, along with methods of using the devices to transform heat energy to electricity, and for refrigeration, are also provided.

15 Claims, 5 Drawing Sheets

(56) References Cited

U.S. PATENT DOCUMENTS

| | | |
|---|---|---|
| 2005/0236028 A1 | 10/2005 | Strnad |
| 2006/0000226 A1 | 1/2006 | Weaver |
| 2006/0162761 A1 | 7/2006 | Tanielian |
| 2007/0023077 A1 | 2/2007 | Tanielian |
| 2007/0137687 A1 | 6/2007 | Tanielian |

FOREIGN PATENT DOCUMENTS

| | | |
|---|---|---|
| EP | 1612492 A1 | 1/2006 |
| WO | 9826880 | 6/1998 |
| WO | 9852233 | 11/1998 |
| WO | 2007032803 | 3/2007 |
| WO | 2007081483 A2 | 7/2007 |

\* cited by examiner

THERMOELECTRIC DEVICES AND METHODS OF MANUFACTURE

REFERENCE TO RELATED APPLICATIONS

The present disclosure is a divisional application of Ser. No. 11/691,239, filed on Mar. 26, 2007, the disclosure of which is herein incorporated by reference in its entirety.

BACKGROUND OF THE INVENTION

A variety of thermoelectric devices, and methods of their manufacture and use, exist today for transforming heat energy to electricity, and/or for cooling applications, such as solid state refrigerators. Many of the existing thermoelectric devices, and methods of their manufacture and use, experience one or more problems such as: having a complex, expensive, and/or timely manufacturing process; being inefficient; being inconsistent, unreliable, and/or not durable; and/or experiencing one or more other types of problems.

A thermoelectric device, and/or method of its manufacture and use, is needed to decrease one or more problems associated with one or more of the existing thermoelectric devices and/or methods.

SUMMARY OF THE INVENTION

In one aspect of the invention, a device is provided comprising a glass wafer defined by at least one conductive via made of a second material, a second wafer, and at least one metal film disposed in-between the glass wafer and the second wafer. The at least one conductive via extends through the glass wafer and ends at a solid, conductive, integral, end surface of the at least one conductive via. The metal film is disposed against the solid, conductive, integral, end surface of the at least one conductive via. A nanogap is disposed in between the metal film and the second wafer. The nanogap was created by applying a voltage extending between the conductive via and the second wafer.

In another aspect of the invention, a method of forming a device is disclosed. In one step, a glass wafer is provided which is defined by at least one conductive via made of a second material. The at least one conductive via extends through the glass wafer and ends at a solid, conductive, integral, end surface of the at least one conductive via. In another step, at least one metal film is disposed against the solid, conductive, integral, end surface of the at least one conductive via. In still another step, the glass wafer is bonded to a second wafer so that said at least one metal film is disposed between the glass wafer and the second wafer. In yet another step, a voltage is applied between the at least one conductive via of the glass wafer and the second wafer, in order to create a nanogap in between the metal film and the second wafer.

In a further aspect of the invention, a method is disclosed of using a device to at least one of provide electricity and to act as a refrigerator. In one step, a device is provided which comprises at least one metal film disposed in-between a glass wafer and a second wafer. The metal film is disposed against at least one solid, conductive, integral end surface of at least one conductive via defining the glass wafer. A nanogap is disposed in between the at least one metal film and the second wafer. The nanogap was created by applying a voltage between the at least one conductive via defining the glass wafer and the second wafer. In another step, the device is used to at least one of transform heat energy to electricity and to act as a refrigerator by using provided electricity.

In yet another aspect of the invention, a device is provided comprising a glass wafer defined by at least one conductive via made of a second material, a second wafer, and at least one metal film disposed in-between the glass wafer and the second wafer. The at least one conductive via extends through the glass wafer and ends at a solid, conductive, integral, end surface of the at least one conductive via. The metal film is disposed against the solid, conductive, integral, end surface of the at least one conductive via. A nanogap is disposed in between the metal film and the second wafer. The nanogap was created by applying a voltage extending between the conductive via and the second wafer.

These and other features, aspects and advantages of the invention will become better understood with reference to the following drawings, description and claims.

DETAILED DESCRIPTION OF THE INVENTION

The following detailed description is of the best currently contemplated modes of carrying out the invention. The description is not to be taken in a limiting sense, but is made merely for the purpose of illustrating the general principles of the invention, since the scope of the invention is best defined by the appended claims.

Figure 1:
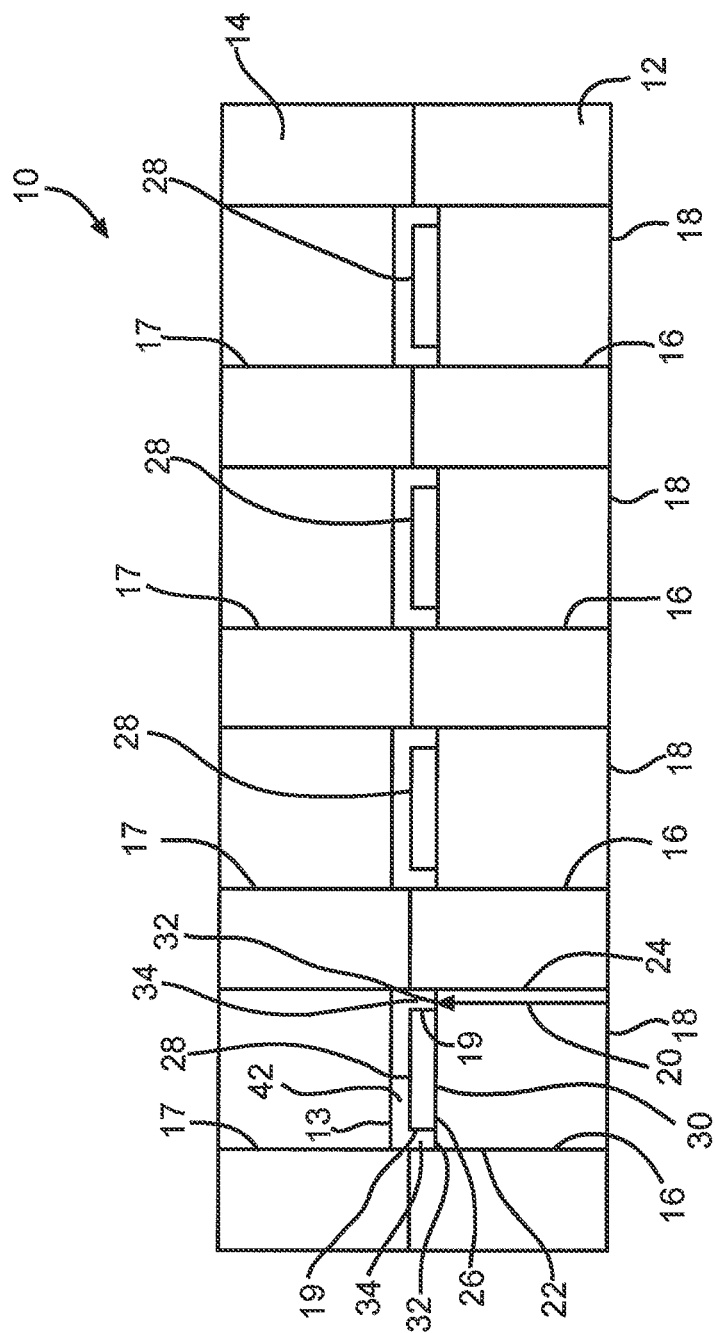
FIG. 1 shows a front-view of one embodiment of a thermoelectric device.

FIG. 1 depicts one embodiment of a thermoelectric device 10, which may be used for transforming heat energy to electricity, or may be used as a refrigerator for cooling by providing electricity to the device 10. The device 10 may be used both as an energy conversion device, or as a cooling device, such as a solid state refrigerator. As discussed more thoroughly below, the thermal conductivity of the thermoelectric device 10 may be substantially lower than a device having a continuous thermal path, while its electrical conductivity may remain substantially higher, thus allowing the device 10 to transform heat energy to electricity in an efficient manner. The thermoelectric device 10 may include a glass wafer 12 and a second wafer 14. The glass wafer 12 may be defined by a plurality of conductive vias 16 which are made of a second material which is conductive, such as a metal material which is substantially doped, like doped silicon, a semi-metal, or other electrically and thermally conductive material. The conductive vias 16 are defined as conductive pathways. In other embodiments, any number of conductive vias 16 may be used. The conductive vias 16 may be open at one end 18, may extend through the glass wafer 12 along direction 20, may have conductive side-walls 22 and 24, may end at solid, conductive, integral, end surfaces 26, and may be substantially doped in order to be very conductive. In such manner, the conductive vias 16 may be integral, one-piece vias 16 extending through the glass wafer 12. The conductive vias 16 may be in a parallel array configuration as shown, with bucket or U-shaped vias, but in other embodiments, may be in any shape, size, or configuration.

Figure 2:
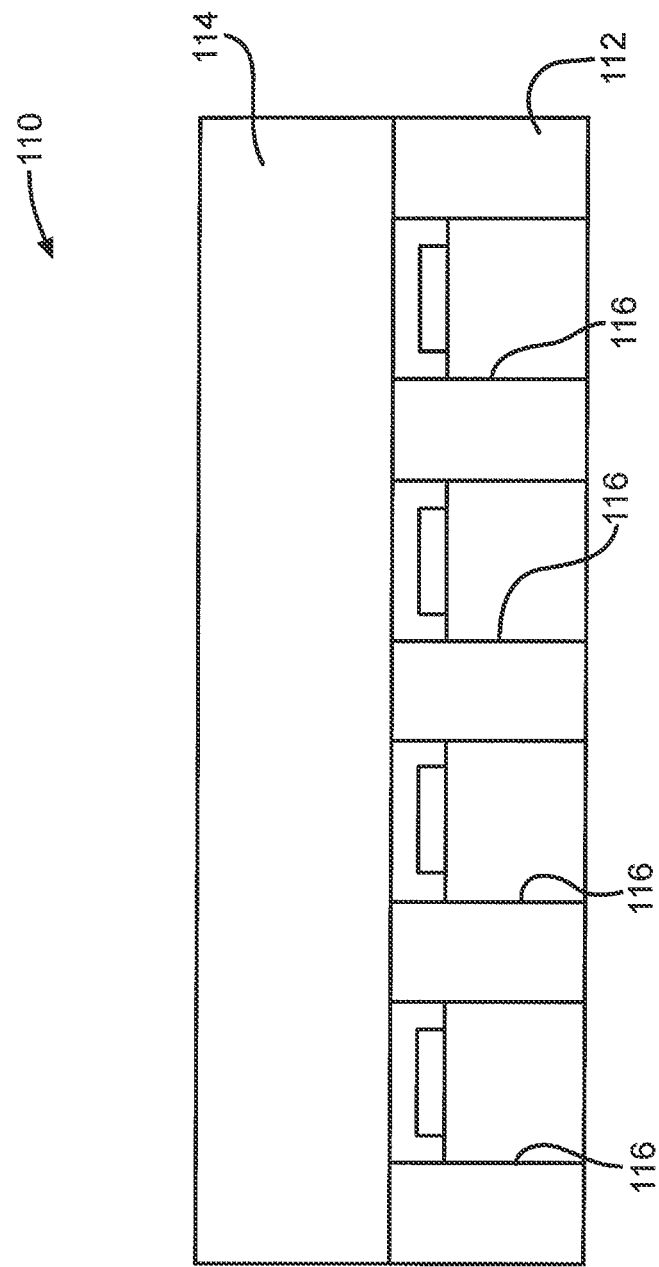
FIG. 2 shows a front-view of another embodiment of a thermoelectric device.

The second wafer 14 may be identical to the glass wafer 12. In such manner, the second wafer 14 may be made of glass, and may have a plurality of conductive vias 17 extending through the second wafer 14 in the same configuration as in the glass wafer 12. In one embodiment, the respective conductive vias 16 and 17 of both the glass wafer 12 and the second wafer 14 may both be made of silicon. In other embodiments, the second wafer 14 may differ from the glass wafer 12 in material, shape, size, configuration, type, and/or may have no conductive vias 17 or a varying number of conductive vias 17. For instance, in one embodiment, the second wafer 14 may be identical to the glass wafer 12 in shape, but may have conductive vias 17 made of a different material, such as a semiconductor other than silicon or with different type of doping, than the conductive vias 16 of the glass wafer 12. In still another embodiment, a p-n junction may be formed between the conductive vias 17 of the second wafer 14 and the conductive vias 16 of the glass wafer 12. In yet another embodiment, as shown in FIG. 2, the second wafer 114 of a thermoelectric device 110 of another embodiment may comprise a solid silicon wafer 114, without any conductive vias, while the glass wafer 112 may be identical to the glass wafer 12 of FIG. 1 with conductive vias 116. A p-n junction may be formed between the conductive vias 116 of the glass wafer 112 and the second wafer 114. In yet another embodiment, the second wafer 114 may comprise a semiconductor other than silicon. In still another embodiment, the second wafer 114 may comprise a solid semiconductor wafer having different doping than the conductive vias 116 of the glass wafer 112.

As shown in FIG. 1, a plurality of metal film 28 may be disposed in-between the glass wafer 12 and the second wafer 14. Each metal film 28 may be disposed against a corresponding solid, conductive, integral, end surface 26 of one of the conductive vias 16 of the glass wafer 12. In other embodiments, any number of metal film 28 may be used. In still other embodiments, the device 10 may not have any metal film 28. The metal film 28 may be thin, or in any shape, size, or configuration. Each metal film 28 may not completely cover each of the respective solid, conductive integral, end surfaces 26 of each of the respective conductive vias 16. For instance, each metal film 28 may cover an internal portion 30 of each of the solid, conductive, integral, end surfaces 26 of each of the conductive vias 16, but may not cover perimeters 32 of each of the conductive end surfaces 26. In other embodiments, each metal film 28 may completely cover the perimeters 32 of each of the conductive end surfaces 26, and/or be in different sizes, locations, and configurations. One or more nanogaps 42 may be disposed between the metal film 28 of the glass wafer 12 and the second wafer 14. The nanogaps 42 may comprise small, open gap areas of open space which are substantially between 0-2 nanometers, and may have been created by applying a voltage extending between the conductive vias 16 and the second wafer 14. The nanogaps 42 may help the device 10 have a lower thermal conductivity while maintaining a much higher electrical conductivity by increasing the distance of the thermal path, and thereby lowering the device's thermal conductivity. One or more troughs 34 may be disposed to the sides 19 of the metal film 28 at the perimeters 32 of each of the end surfaces 26 in between the glass wafer 12 and the second wafer 14. The troughs 34 may comprise small, open gap areas of open space which are substantially between 0 to 150 nanometers. In other embodiments, the troughs 34, nanogaps 42, glass wafer 12, second wafer 14, metal film 28, and/or conductive vias 16 and 17 may be in varying sizes, shapes, and configurations.

The glass wafer 12 and the second wafer 14 may be bonded together using an anodical bonding process, a hydrophilic treatment, or another bonding process known in the art. The metal film 28 may be disposed between the bonded together glass wafer 12 and second wafer 14.

Figure 3:
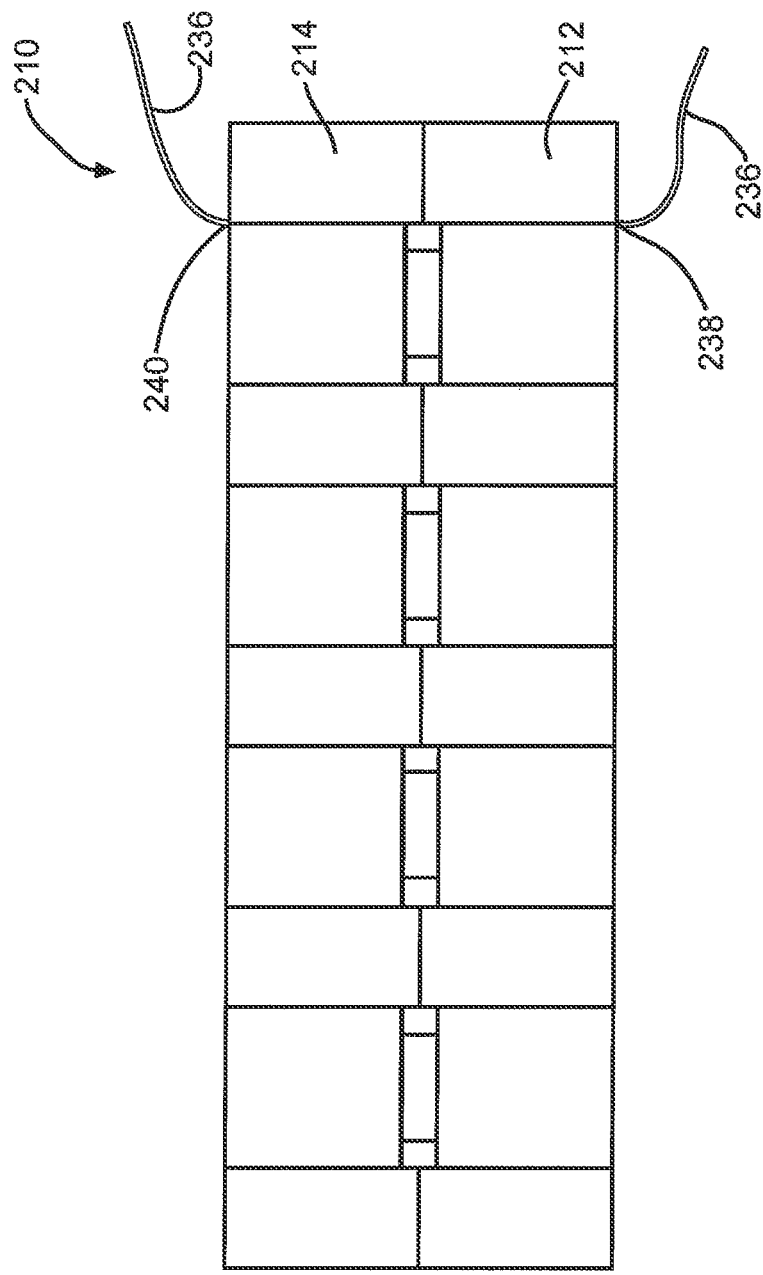
FIG. 3 shows a front-view of yet another embodiment of a thermoelectric device with electrical wires connected to the device.

FIG. 3 shows another embodiment having the same thermoelectric device 210 as in FIG. 1, with the exception that no nanogaps have been created yet. Electrically-charged wires 236 may be attached to respective metalized back-sides 238 and 240 of the glass wafer 212 and second wafer 214. By running electricity through the electrically charged wires 236 of FIG. 3, one or more nanogaps 42 may be produced as shown in the device 10 of FIG. 1. The nanogaps 42 may be substantially between 0 to 2 nanometers, and may be created between the metal film 28 of the glass wafer 12 and the adjacent surface 13 of the second wafer 14, which in this embodiment is a portion of conductive via 17, but in other embodiments, may be various portions of the second wafer 14. The nanogaps 42 may help the device 10 have a substantially lower thermal conductivity than a continuous material, while maintaining a moderate to much higher electrical conductivity due to the presence of the vacuum nanogaps 42 between the hot and cold sides of the thermoelectric device 10 and the ability of the electrons to tunnel through the vacuum nanogaps 42. This may allow the device 10 to transform heat energy to electricity in a more efficient manner than current thermoelectric devices.

Figure 4:
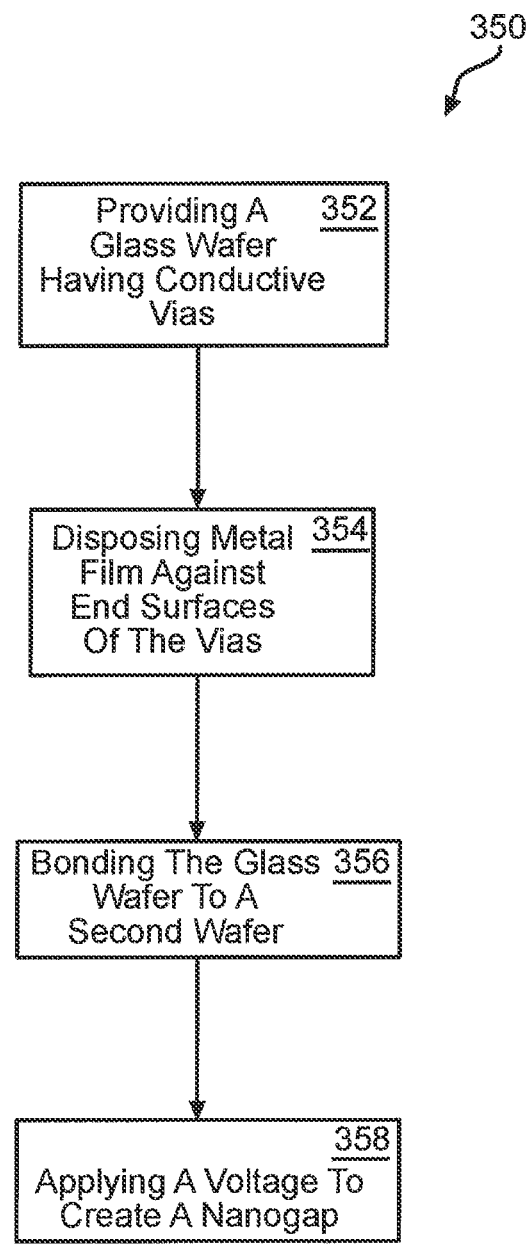
FIG. 4 is a flowchart depicting one embodiment of a method of forming a thermoelectric device.

FIG. 4 shows a flow-chart of one embodiment 350 of a method of forming a device. In one step 352, a glass wafer may be provided. The glass wafer may be defined by one or more conductive vias made of a second material. The conductive vias may extend through the glass wafer, and may end at solid, conductive, integral, end surfaces of the conductive vias. In other embodiments of the method, the glass wafer and the conductive vias may comprise any of their embodiments disclosed herein. The glass wafer may have been manufactured by patterning a silicon wafer, using photolithography and deep RIE, which may have resulted in a multitude of silicon needles protruding from the surface of the silicon substrate. This may have been followed by flowing wafer molten glass onto the surface of the silicon wafer. The front and back surfaces of the formed wafer may have then been polished to form a glass wafer having solid silicon vias embedded in it. A specified resistivity and size of the silicon vias may have been obtained by pre-determining the silicon wafer type, shape, size, and/or material, along with the type, shape, size, material, and/or number of the needles, to obtain the results desired.

In another step 354, one or more metal films may be disposed against the solid, conductive, integral, end surfaces of the conductive vias. The metal film may comprise any of the metal film embodiments disclosed herein. In one embodiment, the metal films may be disposed so that they do not completely cover the solid, conductive, integral, end surfaces of the conductive vias. In still another embodiment, the metal films may be disposed so that they cover internal portions of the solid, conductive, integral, end surfaces of the conductive vias, but do not cover perimeters of these conductive end surfaces. In other embodiments, the metal film may be disposed in varying configurations.

In yet another step 356, the glass wafer may be bonded to a second wafer with the metal films disposed between the glass wafer and the second wafer. The second wafer may comprise any of the second wafer embodiments disclosed herein. In one embodiment, during the bonding, at least one trough, which may be between 0 to 150 nanometers, may be formed adjacent the metal film in between the glass wafer and the second wafer. The trough may comprise an open gap. In another embodiment, the glass wafer may be bonded to the second wafer using at least one of anodical bonding, hydrophilic treatments, or other bonding methods known in the art. In yet another step 358, a voltage may be applied between the conductive via of the glass wafer and the second wafer in order to create a nanogap, which may be between 0 to 2 nanometers, in between the metal film and the second wafer. This may be done by connecting electrically charged wires to metalized back-sides of both the glass wafer and the second wafer, and running an electric charge through the wires.

Figure 5:
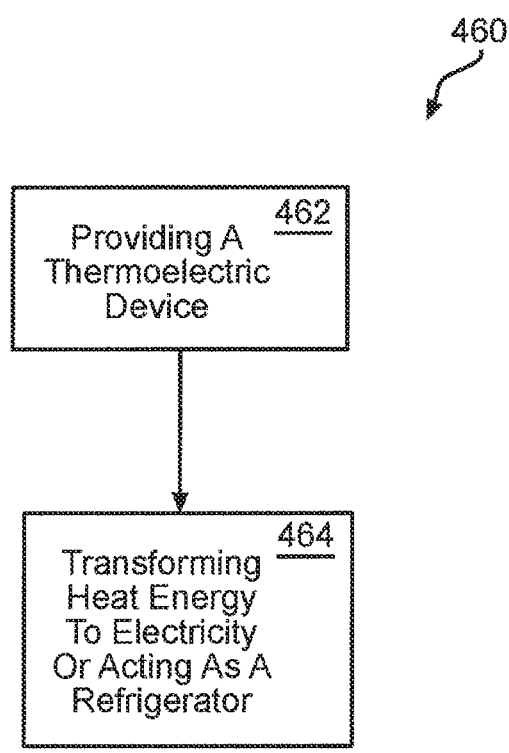
FIG. 5 is a flowchart depicting another embodiment of a method of using a thermoelectric device.

FIG. 5 shows a flow-chart of one embodiment 460 of a method of using a device to at least one of provide electricity and to act as a refrigerator. In one step 462, a thermoelectric device may be provided. The thermoelectric device may comprise at least one metal film disposed in-between a glass wafer and a second wafer. The metal film may be disposed against at least one solid, conductive, integral end surface of at least one conductive via defining the glass wafer. The metal film, glass wafer, second wafer, and conductive vias may comprise any of the embodiments disclosed herein. In one embodiment, the metal film may not completely cover the solid, conductive, integral, end surfaces of the conductive vias. In another embodiment, the metal film may cover internal portions of the solid, conductive, integral, end surfaces of the conductive vias, but may not cover perimeters of these end surfaces. In still another embodiment, one or more nanogaps may be disposed adjacent a top surface of the metal film in between the glass wafer and the second wafer. The nanogaps, may be substantially between 0 to 2 nanometers, and may have been created by applying a voltage between the conductive via of the glass wafer and the second wafer. In yet another embodiment, one or more troughs, which may be substantially between 0 to 150 nanometers, may be disposed adjacent the sides of the metal film in between the glass wafer and the second wafer.

In another step 464, the thermoelectric device may be used to at least one of transform heat energy to electricity and to act as a refrigerator by using provided electricity. The thermal conductivity of the device may be substantially lower than the electrical conductivity of the device. The transforming of heat energy to electricity may be accomplished by heating one side of the device, which may cause electrons to move from the hot side to the cold side of the device traversing the vacuum gap by tunneling, whereas the phonons (lattice heat vibrations) may not be capable of doing so because the nanogap may be too large for them to overcome. This may result in allowing for the maintenance of a large temperature difference between the hot and cold sides of the device, thus increasing its efficiency. The use of the device as a refrigerator may be accomplished by applying electricity or current to the device.

One or more embodiments of the invention may reduce one or more problems associated with one or more of the thermoelectric devices and/or methods of the prior art. For instance, one or more embodiments of the invention may result in: a less complex, less expensive, and less timely manufacturing process; a more efficient device which transforms more heat into electricity, or provides a more efficient refrigerator; a more durable, consistent, and reliable device; and/or may reduce one or more other problems of one or more of the prior art devices and/or methods.

It should be understood, of course, that the foregoing relates to exemplary embodiments of the invention and that modifications may be made without departing from the spirit and scope of the invention as set forth in the following claims.

I claim:

1. A thermoelectric device comprising:
   a glass wafer defined by at least one conductive via made of a second material, wherein said at least one conductive via extends through said glass wafer and ends at a solid, conductive, integral, end surface of said at least one conductive via;
   a second wafer attached to said glass wafer;
   at least one film disposed in-between said glass wafer and said second wafer, and disposed directly against said solid, conductive, integral, end surface of said at least one conductive via without completely covering the solid, conductive, integral, end surface of said at least one conductive via; and
   a nanogap in between said film and said second wafer, wherein said nanogap was created by running electric current directly between the glass wafer, said at least one conductive via, said at least one film, and said second wafer to directly create said nanogap.

2. The thermoelectric device of claim 1 wherein the at least one film is metal.

3. The thermoelectric device of claim 1 wherein the thermoelectric device comprises a refrigerator.

4. The thermoelectric device of claim 1 wherein the thermal conductivity of the thermoelectric device is substantially lower than the electrical conductivity of the thermoelectric device due to the nanogap.

5. The thermoelectric device of claim 1 wherein the second material is metal or semi-metal.

6. The thermoelectric device of claim 1 wherein said glass wafer comprises a plurality of conductive vias.

7. The thermoelectric device of claim 6 wherein said plurality of conductive vias are in a parallel array configuration.

8. The thermoelectric device of claim 1 wherein said second wafer is a solid silicon wafer or a semiconductor other than silicon.

9. The thermoelectric device of claim 1 wherein said second wafer is identical to said glass wafer, or identical to said glass wafer in shape with conductive vias made of a semiconductor other than silicon.

10. The thermoelectric device of claim 1 wherein said at least one film covers an internal portion of the solid, conductive, integral, end surface of said at least one conductive via, but does not cover a perimeter of said solid, conductive, integral, end surface of said at least one conductive via.

11. The thermoelectric device of claim 1 wherein one or more troughs are disposed at one or more sides of said at least one film in between said glass wafer and said second wafer.

12. The thermoelectric device of claim 1 wherein said at least one conductive via is substantially doped.

13. The thermoelectric device of claim 1 wherein said glass wafer and said second wafer are bonded together.

14. The thermoelectric device of claim 1 wherein said nanogap is substantially between 0 to 2 nanometers.

15. The thermoelectric device of claim 11 wherein at least one depth of said one or more troughs are substantially between 0 to 150 nanometers.

* * * * *